(12) United States Patent
Boor

(10) Patent No.: US 7,688,987 B2
(45) Date of Patent: Mar. 30, 2010

(54) ELECTRET MICROPHONE BUFFER CIRCUIT WITH SIGNIFICANTLY ENHANCED POWER SUPPLY REJECTION

(75) Inventor: Steven E. Boor, Plano, TX (US)

(73) Assignee: Knowles Electronics, LLC, Itasca, IL (US)

( * ) Notice: Subject to any disclaimer, the term of this patent is extended or adjusted under 35 U.S.C. 154(b) by 0 days.

(21) Appl. No.: 10/411,730

(22) Filed: Apr. 11, 2003

(65) Prior Publication Data

US 2003/0202669 A1  Oct. 30, 2003

Related U.S. Application Data

(60) Provisional application No. 60/374,986, filed on Apr. 24, 2002.

(51) Int. Cl.
*H04R 3/00* (2006.01)
(52) U.S. Cl. ................................. 381/111; 330/311
(58) Field of Classification Search ......... 381/111–115, 381/94.1, 120, 323, 317, 355, 1, 121, 28, 381/94.5; 330/258, 311, 156, 300, 255, 277
See application file for complete search history.

(56) References Cited

U.S. PATENT DOCUMENTS

| 3,512,100 | A | | 5/1970 | Killion et al. |
| 4,151,480 | A | | 4/1979 | Carlson et al. |
| 4,647,872 | A | * | 3/1987 | Johnson ........................ 330/311 |
| 5,083,095 | A | * | 1/1992 | Madaffari ..................... 330/277 |
| 5,097,224 | A | | 3/1992 | Madaffari et al. |
| 5,337,011 | A | | 8/1994 | French et al. |
| 5,589,799 | A | | 12/1996 | Madaffari et al. |
| 5,861,779 | A | * | 1/1999 | Loeppert et al. ............. 330/277 |
| 6,504,409 | B1 | * | 1/2003 | Laletin ........................ 327/175 |
| 6,853,227 | B2 | * | 2/2005 | Laletin ........................ 327/175 |

FOREIGN PATENT DOCUMENTS

EP  0 880 225 A2  11/1998
EP  0 969 695 A1  1/2000

OTHER PUBLICATIONS

European Search Report for Application No. 03 25 2400.1 dated Jun. 18, 2003.

* cited by examiner

*Primary Examiner*—Xu Mei
*Assistant Examiner*—Lun-See Lao
(74) *Attorney, Agent, or Firm*—Fitch, Even, Tabin & Flannery

(57) ABSTRACT

A microphone buffer circuit being adaptable for connection to a power source is disclosed. The microphone buffer circuit includes an input transistor operably connected between an input and an output for buffering an input signal. The microphone buffer circuit includes a means for reducing power supply noise capable of being coupled to the input transistor wherein the means being operably connected to the input transistor and the power source.

11 Claims, 2 Drawing Sheets

ELECTRET MICROPHONE BUFFER CIRCUIT WITH SIGNIFICANTLY ENHANCED POWER SUPPLY REJECTION

CROSS-REFERENCE TO RELATED APPLICATIONS

This application claims the benefit of U.S. Provisional Patent Application Ser. No. 60/374,986, entitled "Electret Microphone Buffer Circuit With Significantly Enhanced Power Supply Rejection," filed Apr. 24, 2002. This application is incorporated herein by reference.

FEDERALLY SPONSORED RESEARCH OR DEVELOPMENT

Not Applicable.

TECHNICAL FIELD

This invention relates to input buffer circuits for a microphone. More specifically, the present invention is directed to a method and apparatus for enhancing the power supply immunity of a buffer circuit for a microphone.

BACKGROUND OF THE INVENTION

Hearing aid performance continues to be enhanced by technological advances in audio signal processing capabilities, e.g. primarily via Digital Signal Processing, environmental adaptation, programmability, and noise cancellation techniques. An effect of such on-going efforts, suppliers of miniature acoustic transducers are often requested by hearing aid manufacturers to provide these and other performance improvements.

Today, one performance limitation for miniature electret microphones is the rather limited power supply noise immunity, i.e., Power Supply Rejection (PSR), of its internal impedance buffering circuit. A typical buffer circuit has a PSR of approximately 26 dB. To overcome the limited PSR of the electret microphone, hearing aid manufacturers can utilize either of two possible solutions: operating the microphone from a high PSR regulated power supply voltage within the hearing aid; or, filtering the battery voltage with a resistor-capacitor (RC) low-pass filter having a relatively low resistor value, e.g., approximately Kilo-ohms—to prevent a large voltage drop from the battery voltage to the circuit—along with a relatively high capacitance value, e.g., approximately tens of micro-Farads. For acceptable performance, hearing aid systems typically require at least 50 dB of PSR over the entire audio frequency band.

Unfortunately, both of these two solutions require additional components and/or circuitry in the hearing aid system and thus contribute to an undesired increase in system complexity. The increased system complexity further results in higher manufacturing costs and a greater likelihood of reliability problems in the final product.

An alternative and much more appropriate solution to the limited PSR performance would be to address the root cause of the problem and improve the PSR properties of the impedance buffering circuit. A desirable PSR solution would be one that maintains the same microphone size, battery current consumption, noise performance, and sensitivity, with little or no degradation in audio fidelity or usable dynamic range. Incorporating a voltage regulator into the microphone is not an attractive method because a larger IC is required for the new circuitry. Furthermore, additional power is required to operate the regulator. Utilizing the RC filter approach is also unacceptable because the large capacitor value that is required is physically too big to fit into the case of a miniature electret microphone.

The present invention is directed to solve theses and other problems.

SUMMARY OF THE INVENTION

One embodiment of the present invention includes a microphone buffer circuit capable of being connected to a power source. The microphone buffer circuit includes an input transistor operably connected between an input and an output for buffering an input signal. The microphone buffer circuit comprises a means for reducing power source noise capable of being coupled to the input transistor wherein the means being operably connected to the input transistor and the power source.

A further aspect of the present invention includes the means for reducing power source noise being a Depletion NMOS transistor.

Another aspect of the present invention is a method for enhancing the power supply rejection of a microphone input buffer circuit. The microphone input buffer circuit is powered by a power source and comprises an input transistor operably connected to an input and an output. An input bias is operably connected to the input and the input transistor. A voltage divider is connected between the input transistor bias, the input transistor, and the output, wherein the method comprises the step of reducing power supply noise capable of being coupled to the input transistor.

One object of the present invention is to provide a method for substantially enhancing the power supply immunity of a microphone buffer circuit.

Another object of the present invention is to provide a buffer circuit for a microphone wherein the power supply immunity of the buffer circuit is greater than 50 dB.

Yet another object of the present invention is to provide an impedance buffering circuit for a microphone with improved Power Supply Rejection (PSR) properties while maintaining the microphone's size, battery current consumption, noise performance, and sensitivity with little or no degradation in audio fidelity or usable dynamic range.

These and other aspects and attributes of the present invention will be discussed with reference to the following drawing and accompanying specification.

DETAILED DESCRIPTION OF THE INVENTION

Figure 1:
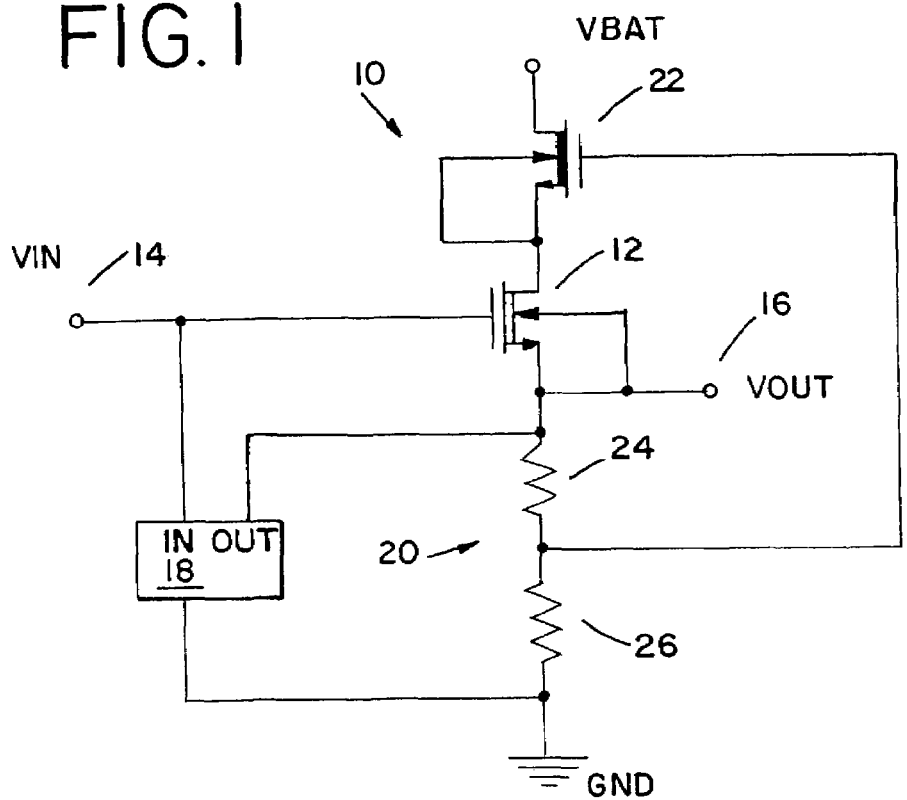
FIG. 1 depicts a buffer circuit for a microphone utilizing one embodiment of the present invention.

While this invention is susceptible of embodiment in many different forms, there is shown in the drawings, and will be described herein in detail, a specific embodiment thereof with the understanding that the present disclosure is to be considered as an exemplification of the principles of the invention and is not intended to limit the invention to the specific embodiments illustrated.

A microphone buffer circuit employing one embodiment of the present invention is shown in FIG. 1. The buffer input circuit 10 includes an input transistor 12 operably connected to an input 14 and an output 16. An input bias 18 is connected to the input 14, the input transistor 12, and the output 16. A voltage divider 20 is connected to the input bias 18, the input transistor 12, and the output 16. These components are commonly used in state-of-the-art impedance buffer circuits. To improve the buffer circuit's Power Supply Rejection (PSR), a transistor 22 is incorporated into the circuit 10. Utilizing a single device to improve the buffer PSR is advantageous because no additional current is required for operation, and the small size of the device has a minimal impact on the overall circuit size—further facilitating placement inside the case of the microphone assembly.

The transistor 22, e.g., Depletion NMOS, performs a cascoding function for the drain voltage of the input transistor 12. A well known additional benefit of cascoding is its conducive properties for low noise circuit performance. The cascading function of the transistor 22 essentially reduces the amount of AC power supply noise that can potentially couple to the drain of the input transistor 12—which is necessary to improve the overall PSR of the buffer circuit 10. The amount of AC supply noise reduction via cascading is typically in the range of about 34 dB, and results from a voltage divider ratio of the output conductance of the transistor 22 (Gds) to its transconductance (Gm). Thus, the amount of AC variation at the drain of the input transistor 12 is essentially reduced by the factor Gds/(Gds+Gm). Since it is relatively easy to obtain a Gds value that is 50 times lower than Gm, one can readily conclude that the amount of PSR at the drain of the input transistor 12 will be approximately 34 dB.

Given that the original buffer circuit itself (not including the cascode transistor 22) already has a PSR of about 26 dB, the total PSR of the cascoded version of this buffer will be on the order of approximately 34 dB+26 dB, or about 60 dB. This high level of PSR performance clearly exceeds the 50 dB minimum requirement mentioned above. The present invention is readily usable in a hearing aid without the need for any external components. Note that this improvement was obtained without additional current drain from the power supply, i.e., the battery ($V_{BAT}$), since the current needed to flow through the cascode transistor 22 is already flowing through the input transistor 12.

One imperfection of the cascode configuration is that it is possible, without careful design of the buffer circuit 10, for the transistor 22 to cause the input transistor to function out of its normal mode of operating in saturation—either at DC or under large acoustic sound conditions, and vice-versa. In order for the microphone buffer 10 to have both good PSR and good total harmonic distortion (THD) performance simultaneously, the voltage between drain and source, i.e., $V_{DS}$, for each transistor must always be greater than their respective saturation voltages, $V_{Dsat}$. If optimal biasing is not maintained for the input transistor 12, then its Gm will necessarily decrease and result in a non-linear distortion degradation of the buffer circuit 10. In other words, the useful dynamic range of the microphone will be substantially reduced. If optimal biasing is not maintained for the cascode transistor 22, then the PSR of the microphone buffer 10 will be substantially reduced. To avoid any substantial decreases in the useful dynamic range and the PSR of the microphone, the optimal biasing of the input transistor 12 and the cascode transistor 22, are critical factors in the overall buffer design.

FIG. 1 provides a means of obtaining the desired biasing configuration for the input transistor 12 and the cascode transistor 22 by providing a high PSR and a low THD performance under both large and small signal AC conditions (primarily due to connecting the gate of the cascode transistor 22 to a divided down version of $V_{OUT}$), while maintaining low noise performance and a minimum area of implementation. This is a result of using the voltage divider circuit 20—a first resistor 24 and a second resistor 26 —to bias and drive the gate of the cascode transistor 22.

Figure 2:
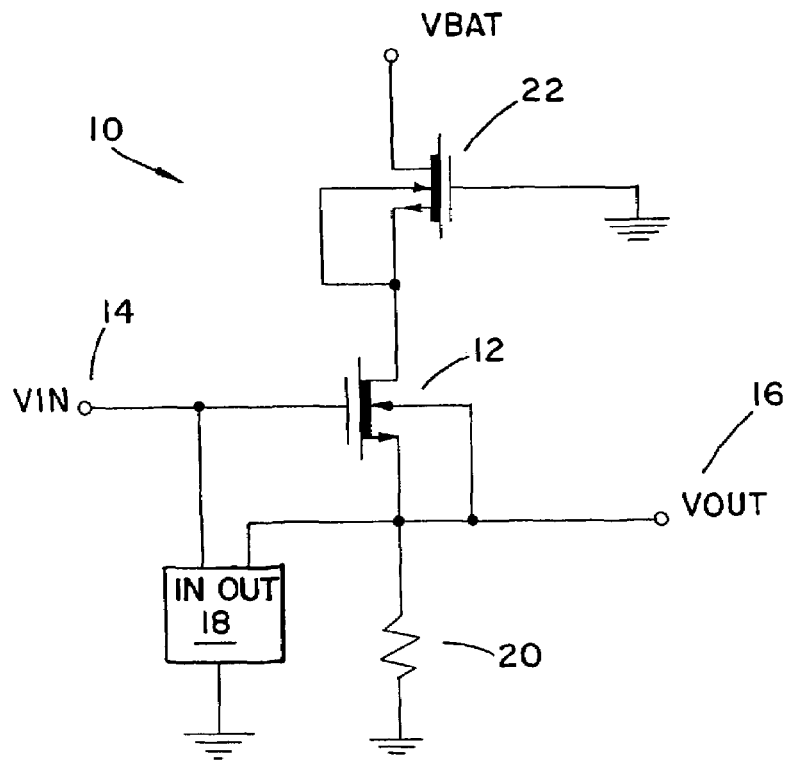
FIG. 2 is an alternative embodiment of the present invention.

Alternative cascoding architectures also exist, but do not lend themselves to nearly the level of PSR and dynamic range performance, or ease of implementation. One such architecture shown in FIG. 2 consists of grounding the gate of the cascode transistor 22, but because this configuration results in such a large width-to-length ratio for the transistor to achieve good PSR and dynamic range performance, the area of the overall circuit becomes untenable.

Figure 3:
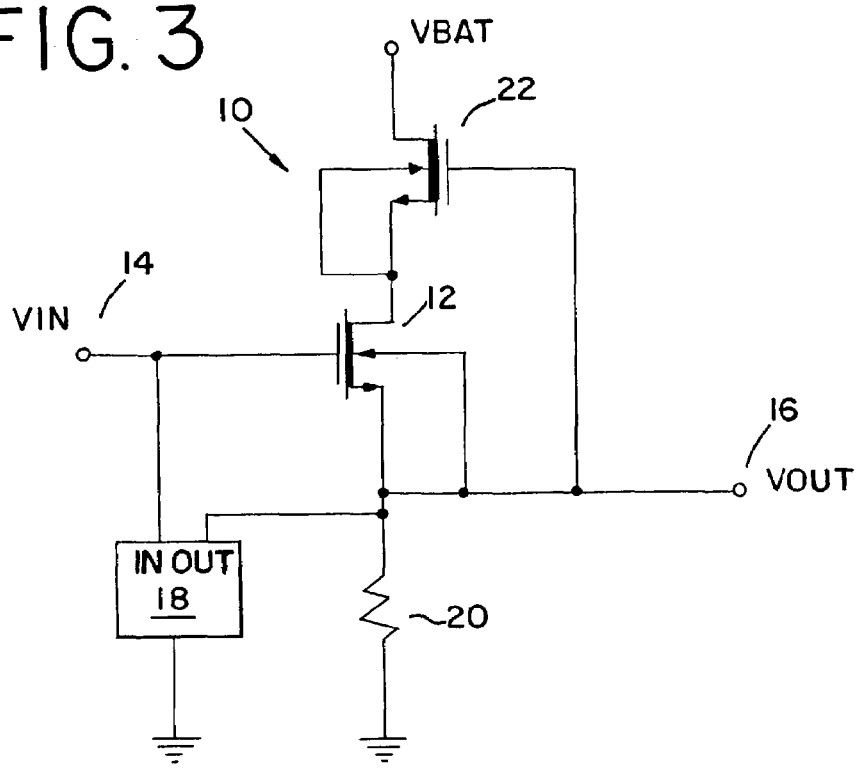
FIG. 3 is another alternative embodiment of the present invention.
Figure 4:
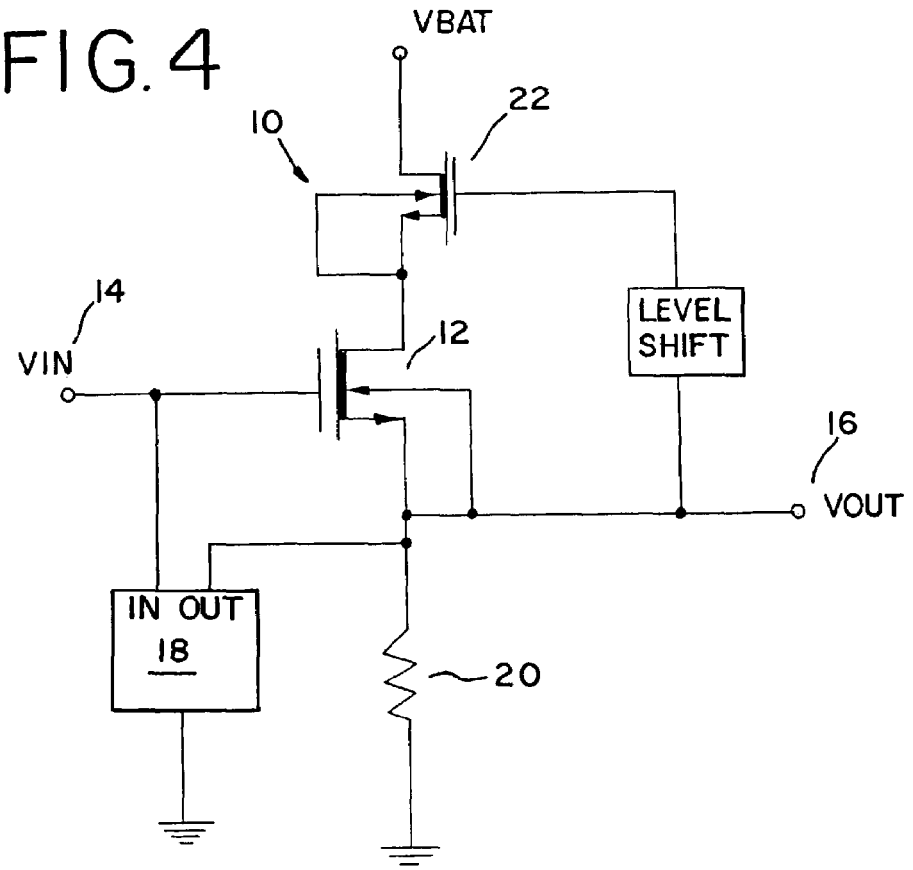
FIG. 4 is another alternative embodiment of the present invention.

Another alternative architecture shown in FIG. 3 consists of connecting the gate of the cascode transistor 22 to the source terminal of the input transistor 12, i.e., the $V_{OUT}$ pin. This configuration is satisfactory for small signal AC conditions, but is quite poor for PSR under large AC signal conditions since the $V_{DS}$ voltage for transistor 22 much more easily drops below its $V_{Dsat}$ voltage, i.e., where its Gds—Gm ratio falls dramatically. Yet another conceivable alternative cascode architecture shown in FIG. 4 utilizes a level-shifted version of $V_{OUT}$ to bias and drive the gate of the cascode transistor 22 and could provide the same level of PSR and dynamic range as the preferred embodiment, but a significant amount of additional circuit complexity, battery current, and circuit area would be needed for its implementation.

Note also that it would be possible to achieve an electret microphone buffer circuit 10 with high PSR and large dynamic range performance using a PMOS input buffer architecture having a filtered and/or cascoded current reference for its biasing. However, the preferred architecture discussed above is expected to require much less circuit area and power than any kind of PMOS buffer implementation for the same level of PSR, noise, and THD performance. This is due in part because the current references and filters that are needed for a PMOS buffer with high PSR and low noise performance require significant chip area and additional battery current consumption, which are not needed for this Depletion NMOS buffer implementation.

Typical microphone performance expected from implementing the disclosed cascode architecture is a PSR in excess of 60 dB, and a maximum acoustic level input of 110 dB sound pressure level (SPL) at slightly less than 1% THD at the microphone output.

While specific embodiments have been illustrated and described, numerous modifications come to mind without significantly departing from the characteristics of the invention, and the scope of protection is only limited by the scope of the accompanying claims.

What is claimed is:

1. A microphone buffer circuit being adaptable for connection to a power source, the microphone buffer circuit comprising:

an input transistor configured to receive and buffer an input signal, the input signal being representative of an audio signal, the input transistor having a first amount of power supply noise that is capable of being coupled thereto;

a cascode transistor coupled to the input transistor and a power source, the cascode transistor being configured to receive a current, the current being received directly from the power source and operable to bias the cascode transistor a biasing circuit coupled to and separate from the input transistor and coupled to and separate from the cascode transistor, the biasing circuit operable to cause the cascode transistor and the input transistor to operate within a predetermined operating range, the biasing circuit being disposed between the cascode transistor and an output of the microphone buffer circuit and electrically connecting the cascode transistor to the output of the microphone buffer circuit;

such that the cascode transistor is configured to cascode the first amount of power supply noise into a second amount of power supply noise, the second amount of power supply noise being significantly reduced from the first amount of power supply noise; and such that the current drawn from the power source required to bias the cascode transistor does not substantially increase when the cascode transistor reduces the first amount of power supply noise.

2. The microphone buffer circuit of claim 1, wherein the power supply noise is AC.

3. The microphone buffer circuit of claim 1, wherein the cascode transistor is a Depletion NMOS transistor.

4. The microphone buffer circuit of claim 1, wherein the cascode transistor maintains a voltage bias of the input transistor.

5. The microphone buffer circuit of claim 1, wherein the cascode transistor maintains a drain-source voltage of the input transistor above its saturation voltage.

6. The microphone buffer circuit of claim 1 wherein the biasing circuit comprises a voltage divider.

7. The microphone buffer circuit of claim 1 wherein the operating range is configured so as to avoid a substantial decrease in power supply rejection for the buffer circuit.

8. A method of reducing power supply noise in a microphone buffer circuit, the microphone buffer circuit having an input transistor operably connected to an input terminal to receive an audio signal and an output terminal for buffering an input signal, the input signal being representative of an audio signal, the input transistor having a first amount of power supply noise that is capable of being coupled thereto;

a biasing circuit coupled to and separate from the input transistor and coupled to and separate from a cascode transistor, the biasing circuit operable to cause the cascode transistor and the input transistor to operate within a predetermined operating range, the biasing circuit disposed between the cascode transistor and an output of the microphone buffer circuit;

the method comprising:

connecting the cascode transistor directly between a power source to the biasing circuit to subsequently reduce the first amount of power supply noise into a second amount of power supply noise, the second amount of power supply noise being significantly reduced from the first amount of power supply noise;

such that the current drawn from the power source required to bias the cascode transistor does not substantially increase when the cascode transistor reduces the first amount of power supply noise.

9. The method of claim 8 wherein the biasing circuit comprises a voltage divider.

10. A method of reducing power supply noise, comprising:

at a first transistor in a microphone buffer circuit:

receiving an input voltage representative of an audio signal, the first transistor having a first amount of power supply noise that is capable of being coupled thereto;

at a second transistor in the microphone buffer circuit:

receiving a current drawn from a power supply to bias the second transistor;

cascoding the first amount of power supply noise associated with the first transistor to provide a second amount of power supply noise that is capable of being coupled to the first transistor, the second amount of power supply noise being significantly reduced from the first amount of power supply noise;

biasing the second transistor using a separate biasing circuit that is disposed between the second transistor and an output of the microphone buffer circuit;

such that a current drawn from the power supply required to bias the second transistor does not substantially increase during the cascoding.

11. The method of claim 10 wherein the biasing circuit comprises a voltage divider.

* * * * *